United States Patent
Amano et al.

[11] Patent Number: 5,948,485
[45] Date of Patent: Sep. 7, 1999

[54] PLASMA DEPOSITION METHOD AND AN APPARATUS THEREFOR

[75] Inventors: Hideaki Amano; Genichi Katagiri; Makoto Toraguchi, all of Kanagawa-ken, Japan

[73] Assignee: Tokyo Electron Limited, Tokyo, Japan

[21] Appl. No.: 08/626,455

[22] Filed: Apr. 2, 1996

[30] Foreign Application Priority Data

Apr. 5, 1995 [JP] Japan ..................................... 7-106989
Dec. 29, 1995 [JP] Japan ..................................... 7-353549

[51] Int. Cl.$^6$ ......................... H01L 21/31; H01L 21/316; H05H 1/18; H05H 1/30
[52] U.S. Cl. .................................. 427/571; 118/723 MP; 118/723 MR; 427/574; 427/575; 427/579
[58] Field of Search ...................... 156/345; 204/192.23, 204/298.16, 298.34, 298.37, 298.38; 118/697, 702, 723 MR, 723 MP, 723 MA; 438/728, 786, 788; 427/452, 458, 571, 574, 575, 578, 579

[56] References Cited

U.S. PATENT DOCUMENTS

| | | | |
|---|---|---|---|
| 4,705,595 | 11/1987 | Okudaira et al. | 156/643 |
| 4,732,761 | 3/1988 | Machida et al. | 437/228 |
| 4,891,118 | 1/1990 | Ooiwa et al. | 156/345 |
| 5,160,397 | 11/1992 | Doki et al. | 156/345 |
| 5,286,518 | 2/1994 | Cain et al. | 427/574 |
| 5,289,010 | 2/1994 | Shohet et al. | 250/398 |
| 5,427,827 | 6/1995 | Shing et al. | 427/577 |

FOREIGN PATENT DOCUMENTS 3-280539  12/1991  Japan .

OTHER PUBLICATIONS

Japanese Laid Open Patent Publication (KOKAI) No. 3–247767 published on Nov. 5, 1991 and English Abstract.
Japanese Laid Open Patent Publication (KOKAI) No. 63–211630 published on Sep. 2, 1988 and English Abstract.
Japanese Laid Open Patent Publication (KOKAI) No. 63–233549 published on Sep. 29, 1988 and English Abstract.
Japanese Laid Open Patent Publication (KOKAI) No. 61–218134 published on Sep. 27, 1986 and English Abstract.

*Primary Examiner*—Jeffrey E. Russel
*Attorney, Agent, or Firm*—Smith, Gambrell & Russell, LLP; Beveridge, DeGrandi, Weilacher & Young Intellectual Property Group

[57] ABSTRACT

A plasma generating gas and a reactive gas are fed into a vacuum container. A magnetic field and microwaves for plasma generation are applied to the vacuum container, whereupon plasma is generated by ECR, and whereupon, for example, an $SiO_2$ or SiOF film is formed on aluminum wiring. In the initial phase of film deposition, the level of the radio-frequency power for plasma lead-in applied to the stage is adjusted, for example, to zero (first value includes zero) in advance. Then, after the $SiO_2$ or SiOF film has been deposited to a thickness of tens of nanometers, for example, the radio-frequency power for plasma lead-in is adjusted to a normal power level (second value) and applied to the stage. Thereupon, an intensive anisotropic plasma is generated, and a potential distribution corresponding to the self-bias is formed in the plane direction of the wafer. Since the thin $SiO_2$ film is formed on the wafer surface, however, the voltage applied to any existing gate oxide film is lowered by this insulating film. Thus, the gate oxide film can be prevented from being damaged.

8 Claims, 4 Drawing Sheets

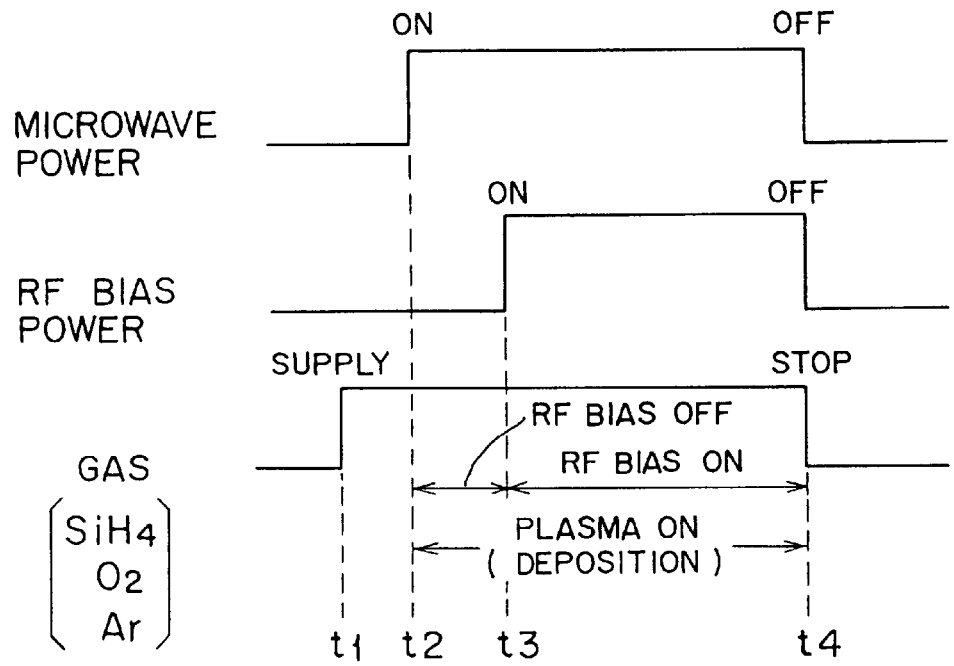
FIG. 2
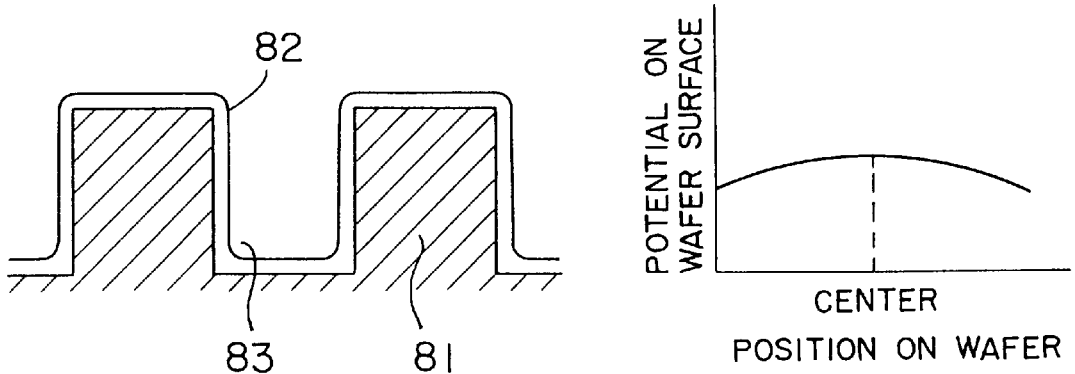
FIG. 3A
FIG. 3B

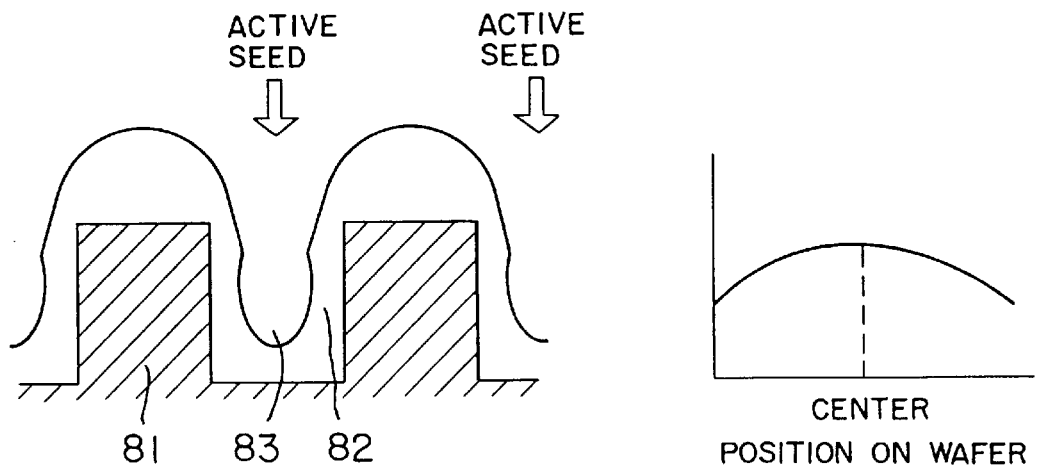
FIG. 4A
FIG. 4B
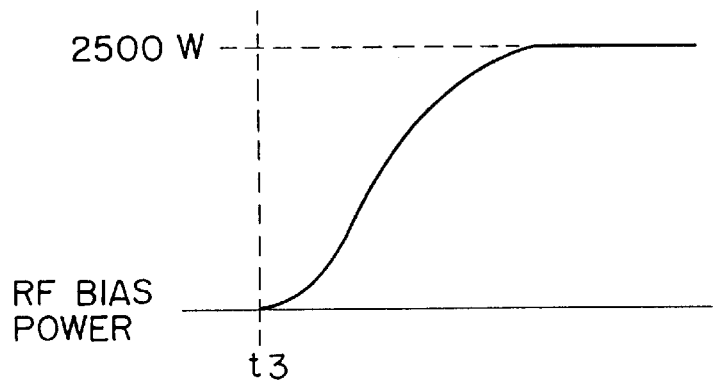
FIG. 5A
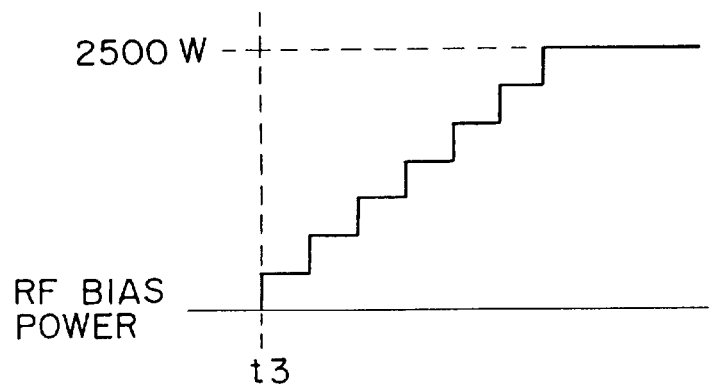
FIG. 5B

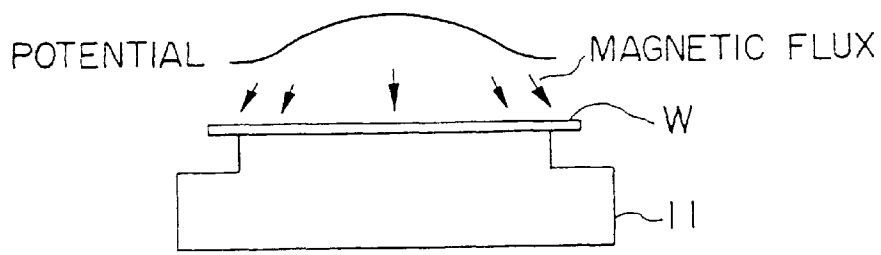
F I G. 8

PLASMA DEPOSITION METHOD AND AN APPARATUS THEREFOR

BACKGROUND OF THE INVENTION

1. Field of the Invention

The present invention relates to a plasma deposition method and an apparatus therefor, utilizing electron cyclotron resonance (hereinafter, ECR).

2. Information of the Related Art

In general, a process for manufacturing a semiconductor integrated circuit, a conductor or nonconductor film is deposited on a semiconductor wafer by repeating thin film depositing operation and etching operation so that a desired integrated circuit is formed thereon.

Aluminum wiring is mainly used for a wiring pattern of the integrated circuit, and a $SiO_2$ or SiOF film is used as the material of a layer insulating film for insulating the wiring. The $SiO_2$ or SiOF film can be formed with good quality by ECR plasma process which combines microwaves and a magnetic field.

FIG. 6 shows an example of a prior art plasma process apparatus which carries out the ECR plasma process. Microwaves of, for example, 2.45 GHz are introduced into a vacuum container 1 through a waveguide (not shown), and at the same time, a magnetic field with a predetermined intensity, e.g., 875 G, is applied by means of a magnetic coil 10. Plasma generating gases, such as Ar and $O_2$ gases, are converted into high-density plasmas through the interaction (resonance) between the microwaves and the magnetic field. A reactive gas, such as $SiH_4$ or $SiF_4$ gas, is activated to form an ion seed by means of the plasma, and the surface of a semiconductor wafer W on a stage (susceptor) 11 is subjected to sputter etching and deposition at the same time. The sputter etching and depositing operations, which run counter to each other, are controlled so that the deposition is macroscopically superior to the sputter etching.

Generally, in the ECR plasma process, a negative radio-frequency bias voltage of 13.56 MHz from a radio-frequency power supply unit 12 is applied to the stage 11 which bears the wafer thereon, so that as many positive ions as possible are attracted to the wafer to maximize the sputtering effect. In sequential operation, the gases are first fed into the vacuum container 1 at time $ta_a$, as shown in FIG. 7, and the microwaves and the radio-frequency bias voltage are simultaneously supplied and applied, respectively, at time $t_b$. The radio-frequency bias voltage is thus applied for the following reason. When the stage is not subjected to any bias, only the deposition is effected in advance, so that there is a high probability that voids will be formed in the aluminum wiring. If the negative bias voltage is applied in the aforesaid manner, on the other hand, the deposition is effected simultaneously with the sputter etching, so that a deposit on the edge portion of the aluminum wiring is influenced mainly by the sputter etching, and film deposition in this region is restrained. As a result, the frontages of recesses between aluminum wires are widened, so that the deposition fully covers a deep part, thus ensuring embedding with fewer voids.

If a radio-frequency bias at a frequency as high as, for example, 13.56 MHz is applied to the wafer W, electrons can move following this frequency. Since ions in the plasma cannot move following the high frequency, however, the electrons accumulate in the surface of the wafer W. When the wafer surface is saturated with the electrons, it acquires a self-bias voltage of a certain level, and a potential distribution is formed in the plane of the wafer W.

This in-plane potential distribution is formed from the following causes. As shown in FIG. 8, magnetic fluxes are not uniformly perpendicular to the wafer surface, and spread out with distance from the central axis of the vacuum container 1. Accordingly, the perpendicularity of the magnetic fluxes is poorer in the peripheral portion of the wafer W than in the central portion, so that the electrons reach the peripheral portion with a delay. Another presumable cause is that the vacuum container 1 on the ground side does not face the wafer W perfectly, as shown in FIG. 6.

If the in-plane potential distribution is not uniform in forming the layer insulating film of a device on, for example, the aluminum wiring on the wafer surface, however, existing insulating films, such as a gate oxide film of a transistor, may be damaged from the following cause, in some cases. Since the substrate of the transistor has the same potential in the plane direction, the gate oxide film is subjected to a potential difference corresponding to the aforesaid potential distribution through the substrate, in the initial phase of film deposition, that is, in the state that the aluminum wiring is practically exposed.

The gate oxide film has a very small thickness of, for example, 50 to 100 angstroms, and its withstand voltage is about 10 volts. In some cases, therefore, the aforesaid potential difference exceeds the withstand voltage, so that the gate oxide film may be deteriorated or broken down in the end.

Thus, in forming, for example, the layer insulating film by the conventional ECR plasma process method, the gate oxide film may possibly be damaged, so that the yield of products cannot be improved.

SUMMARY OF THE INVENTION

The object of the present invention is to provide a plasma deposition method and an apparatus therefor, in which existing thin films, such as a gate oxide film, can be prevented from being damaged as an insulating film is formed by ECR plasma process, so that the yield of products can be improved.

According to an aspect of the present invention, there is provided a plasma deposition method, converting a plasma gas into a plasma by utilizing electron cyclotron resonance, and activating a reactive gas by the plasma to depositing an insulating film on a substrate to be treated, said method comprising the steps of:

forming a magnetic field toward a stage accommodated in a vacuum container and supporting the substrate to be treated thereon;

supplying microwaves power of predetermined value in the vacuum container, and generating the resonance operation by cooperating with the magnetic field so as to convert the plasma gas into the plasma; and applying bias radio-frequency power on the stage so as to lead in said plasma toward the stage, in the steps, the level of the bias radio-frequency power being adjusted to a first value in the initial phase of film deposition, and to a second value for plasma lead-in greater than the first value after the initial phase of film deposition.

According to another aspect of the invention, there is provided a plasma deposition apparatus, converting a plasma gas into a plasma by utilizing electron cyclotron resonance, and activating a reactive gas by the plasma to depositing an insulating film on a substrate to be treated, said apparatus comprising:

a vacuum container having a stage for supporting the substrate to be treated therein and maintained in a substantially vacuum;

magnetic field forming means for forming a magnetic field toward the stage in the vacuum container;

plasma generating microwaves power supplying means for supplying microwaves power of predetermined value in the vacuum container, and generating the resonance operation by cooperating with the magnetic field so as to convert the plasma gas into the plasma;

plasma lead-in bias radio-frequency power applying means for applying bias radio-frequency power on the stage so as to lead in said plasma toward the stage; and control means for controlling the plasma lead-in bias radio-frequency power applying means so that the level of the bias radio-frequency power is adjusted to a first value in the initial phase of film deposition, and to a second value for plasma lead-in greater than the first value after the initial phase of film deposition.

First, the plasma generating gas and the reactive gas are fed into the vacuum container, the magnetic field and the microwaves for plasma generation are applied in the vacuum container, and the plasma is generated by utilizing ECR, whereupon an $SiO_2$ or SiOF film is formed on aluminum wiring, for example.

The first value may be set to prevent the gate oxide film deposited on the substrate from being damaged. Alternatively, the first value may be set to zero.

In the initial phase of film deposition, the level of the radio-frequency power for plasma lead-in applied to the stage is adjusted, for example, to zero (first value includes zero) in advance. Since a self-bias voltage on the surface of a wafer is then zero, for example, the distribution of potential on the wafer surface practically depends on the potential distribution of the plasma. Since the potential difference of the plasma in the plane direction is as small as one volt at the most, however, a voltage applied to a gate oxide film, which is already formed on the wafer, is low enough not to damage the existing film.

Then, after the $SiO_2$ or SiOF film is deposited to a scanty thickness of tens of nanometers, for example, the radio-frequency power for plasma lead-in is adjusted to the normal power level (second value) and applied to the stage. Thereupon, an intensive anisotropic plasma is generated, and a potential distribution corresponding to the self-bias is formed in the plane direction of the wafer. Since the scanty $SiO_2$ film is formed on the wafer surface, e.g., the aluminum wiring, however, the voltage applied to the existing gate oxide film is lowered by this insulating film. Thus, the gate oxide film can be prevented from being damaged.

According to the present invention, as described herein, existing thin films, such as the gate oxide film, can be prevented from being damaged as the insulating film is formed by the ECR plasma process.

Also, the initial phase of film deposition mentioned herein is not limited to the period of time before the very thin $SiO_2$ or SiOF film covers the wafer surface, and includes a phase in which the deposition of the $SiO_2$ or SiOF film advances to a certain extent such that the embedding can be secured without voids after the radio-frequency power for plasma lead-in is raised to a normal level.

BRIEF DESCRIPTION OF THE DRAWINGS

FIG. 2 is a time chart illustrating the sequence of a method according to the embodiment of the invention;

FIGS. 3A and 3B are respectively diagram and graph for illustrating the state of the surface of a wafer in the initial phase of film deposition based on the method of the invention;

FIGS. 4A and 4B are respectively diagram and graph for illustrating the state of the wafer surface in the middle of film deposition based on the method of the invention;

FIGS. 5A and 5B are a time chart illustrating the sequence of a method according to another embodiment of the invention;

FIG. 8 is a diagram for illustrating potential distribution on the wafer surface.

DETAILED DESCRIPTION OF THE PREFERRED EMBODIMENTS

Figure 1:
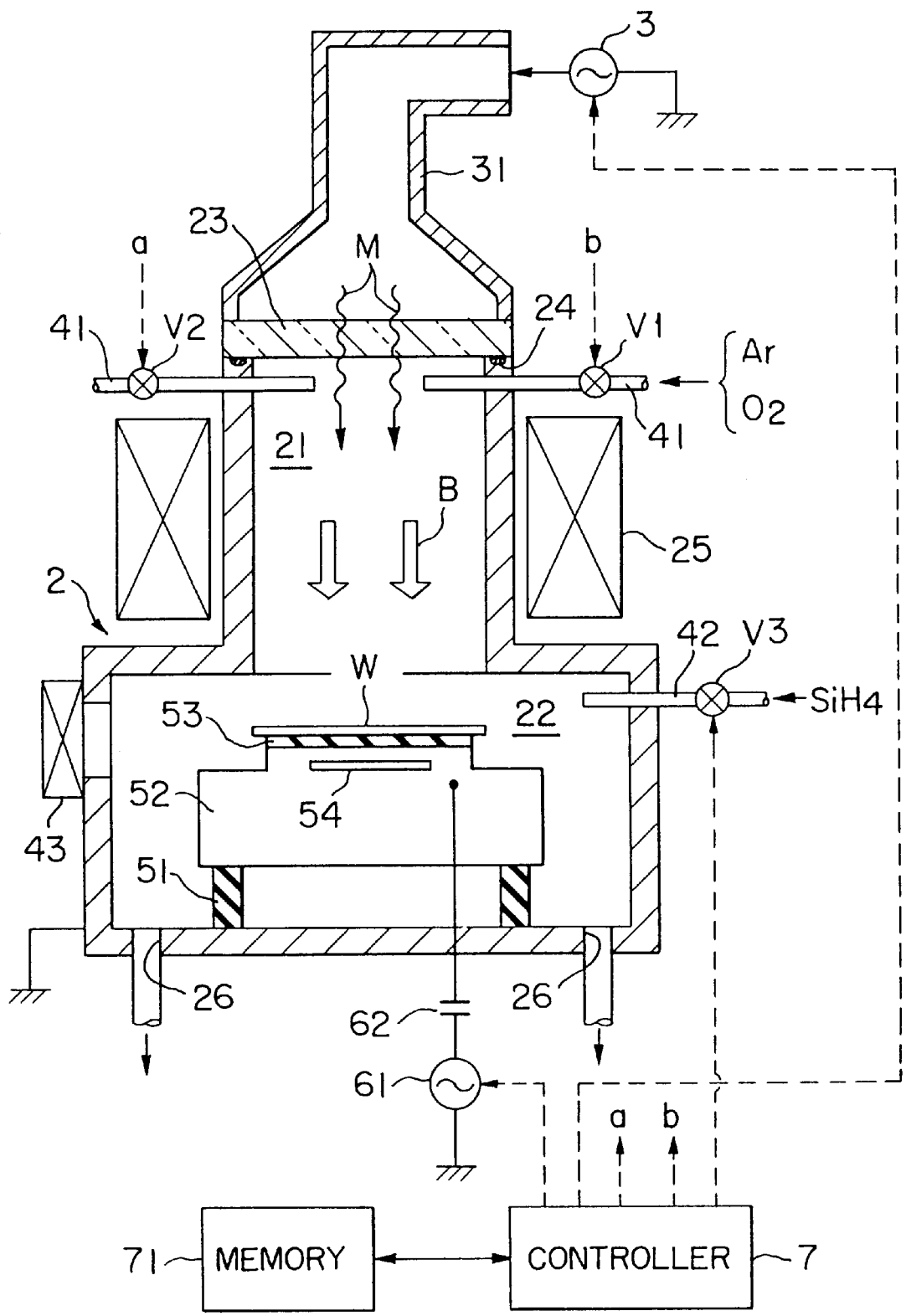
FIG. 1 is a sectional view showing a plasma process apparatus according to an embodiment of the present invention.
Figure 6:
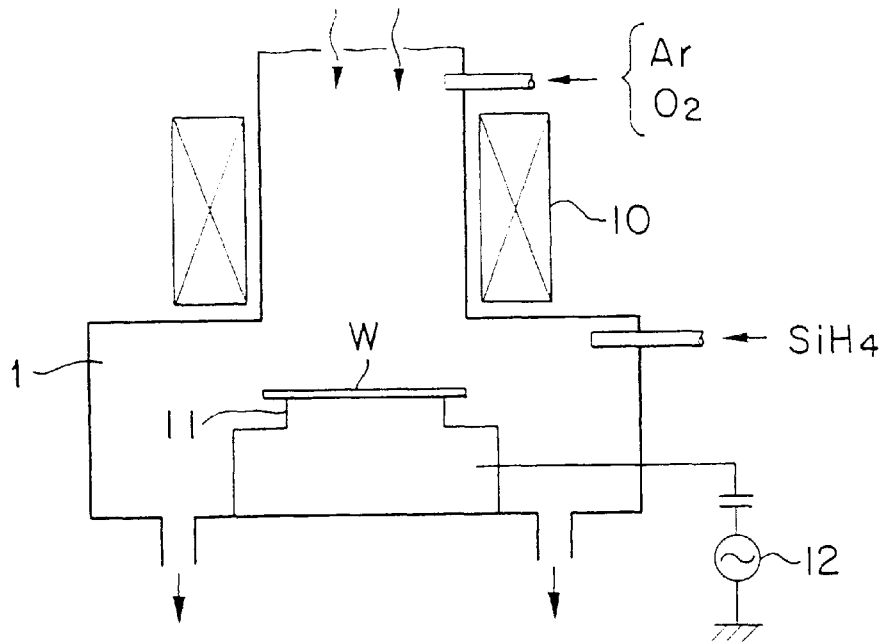
FIG. 6 is a schematic sectional view showing a prior art plasma process apparatus.
Figure 7:
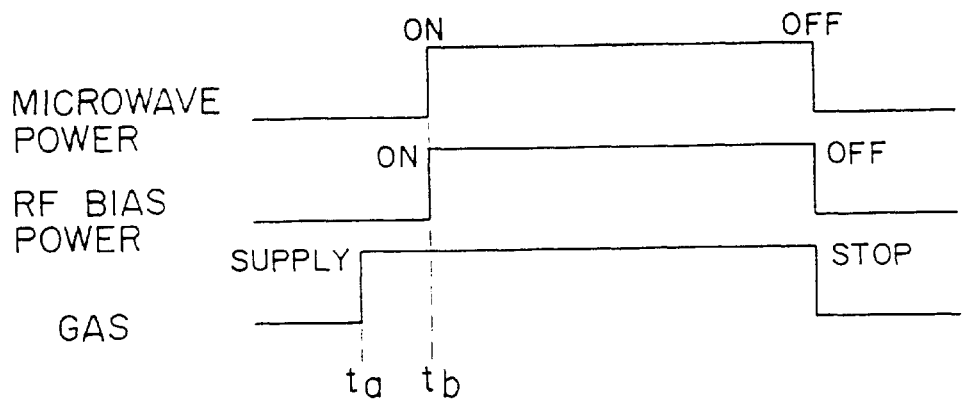
FIG. 7 is a time chart illustrating the sequence of a prior art plasma process method.

A plasma process apparatus according to an embodiment of the present invention will now be described in detail with reference to the accompanying drawings where like-numbered elements are the same. FIG. 1 is a schematic sectional view of the plasma process apparatus. As shown in FIG. 1, the apparatus comprises a stepped vacuum container 2 which is formed of aluminum or the like. The container 2 is divided inside into two parts, a plasma chamber 21 for generating a plasma on the upper side and a reaction chamber 22 connected to the bottom of the chamber 21. The vacuum container 2 is grounded at zero potential.

The vacuum container 2 has a top opening which is fitted with a transparent window 23. The window 23 is formed of quartz or some other material which transmits microwaves, and is hermetically sealed by means of a sealing member 24, such as an O-ring. Thus, the inside of the container 2 can be kept in a vacuum. Provided outside the window 23 is a waveguide 31 which is connected to a microwaves power supply unit 3 for use as microwaves power supply means which generates a plasma of, for example, 2.45 GHz. The waveguide 31 serves to guide microwaves M generated in the power supply unit 3 so that the microwaves can be introduced into the plasma chamber 21 through the transparent window 23.

A side wall which defines the plasma chamber 21 is provided with plasma gas nozzles 41 that are arranged at regular intervals in the circumferential direction of the chamber 21. The nozzles 41 are connected with plasma gas sources (not shown), e.g., Ar and $O_2$ gas sources, so that plasma gases, such as Ar and $O_2$ gases, can be fed equally into the upper portion of the plasma chamber 21. Although only two of the nozzles 41 are shown in FIG. 1 for simplicity of illustration, the nozzles 41 are more in actual number. The side wall defining the plasma chamber 21 is closely surrounded by a ring-shaped magnetic coil 25 for use as magnetic field generating means. Thus, a downward magnetic field B of 875 G, for example, can be formed in the plasma chamber 21, whereby the ECR plasma conditions are fulfilled. A permanent magnet may be used in place of the magnetic coil 25.

As the controlled-frequency microwaves M and the magnetic field B are thus formed in the plasma chamber 21, the introduced gases are subjected to resonance at the aforesaid frequency through the interaction between the microwaves M and the field B, whereupon a plasma is formed at high density. Thus, the apparatus of the invention is an electron cyclotron resonance (ECR) plasma process apparatus.

Provided in the reaction chamber 22, on the other hand, is an aluminum stage 52 for use as a susceptor which is supported on the base of the container 2 by means of an insulating member 51. A semiconductor wafer W, as an object to be treated, is held on the top face or bearing surface of the stage 52 by attraction by means of, for example, an electrostatic chuck 53. The stage 52 is provided, for example, with a ceramic heater 54 for heating the wafer W to a predetermined temperature, a pusher pin (not shown), etc. Also, the stage 52 is connected with a radio-frequency power supply unit 61 for plasma lead-in through a blocking capacitor 62, whereby a bias voltage is applied such that ions are confined to the wafer W.

Further, a side wall which defines the reaction chamber 22 is provided with a reactive gas inlet nozzle 42 for introducing a reactive gas, e.g., $SiH_4$ or $SiF_4$ gas into the chamber 22, and an airtight gate valve 43. The valve 43 can be opened so that the interior of the reaction chamber 22 is exposed to the outside when the wafer W is carried into or out from the chamber 22. Alternatively, a plurality of inlet nozzles 42 may be arranged at regular intervals in the circumferential direction of the container 2 so that the gases can be introduced equally into the reaction chamber 22. Formed in the base of the vacuum container 2 is an exhaust port 26, which is connected to a vacuum pump (not shown). Thus, atmospheres in the container 2 can be discharged equally through the exhaust port 26. The plasma process apparatus according to this embodiment further comprises a control unit 7 and a memory unit 71. The control unit 7 controls the on-off operations of the microwaves power supply units 3 and 61 and valves V1, V2 and V3 attached to the gas nozzles 41 and 42. The control unit 7 controls valves V1 and V2 through controller input lines b and a, respectively. The memory unit 71 is stored with given sequence programs for the operation of the apparatus and the like.

Referring now to the time chart of FIG. 2, a method for forming a layer insulating film of, for example, $SiO_2$ or SiOF by using the apparatus of the aforementioned embodiment will be described.

First, the gate valve 43 on the side of the vacuum container 2 is opened, and the wafer W, having aluminum wiring on its surface, is set on the stage 52 by means of a transfer arm (not shown) and is held thereon by attraction by means of the electrostatic chuck 53.

Then, the gate valve 43 is closed to seal the vacuum container 2 hermetically, the atmospheres in the container 2 are discharged through the exhaust port 26 to a predetermined degree of vacuum. Thereafter, the valves V1, V2 and V3 are opened at time t1, as shown in the time chart of FIG. 2. Thereupon, the gases for plasma generation, such as $O_2$ and Ar gases, are introduced into the plasma chamber 21 through the plasma gas nozzles 41, and at the same time, the $SiH_4$ or $SiF_4$ gas is introduced into the reaction chamber 22 through the reactive gas inlet nozzle 42. Thus, the internal pressure of the vacuum container 2 is kept at the level of a predetermined process pressure. Subsequently, the microwaves power supply unit 3 for plasma generation is turned on at time t2, whereupon forming an $SiO_2$ or SiOF film on the wafer W is started.

The microwaves M of 2.45 GHz from the microwaves power supply unit 3 for plasma generation are carried through the waveguide 31 to reach the top portion of the vacuum container 2, and are introduced into the plasma chamber 21 through the transparent window 23. The magnetic field B of 875 G, which is generated by the magnetic coil 25 outside the plasma chamber 21, is applied downward in the chamber 21. The magnetic field B and the microwaves M interact to induce E (electric field)×B (magnetic field), thereby causing electron cyclotron resonance. The resonance converts the Ar and $O_2$ gases into plasmas at higher densities. Plasma ions introduced into the reaction chamber 22 activate the $SiH_4$ or $SiF_4$ gas as the reactive gas therein to form an active seed, thereby depositing the $SiO_2$ or SiOF film on the wafer surface.

When the surface of aluminum wiring 81 is covered by a very thin $SiO_2$ or SiOF film 82 (about 50 nm thick) at time t3 after the passage of a predetermined period of time, as shown in FIG. 3A, radio-frequency power (RF bias power) of 2,500 W at 13.56 MHz, for example, from the radio-frequency power supply unit 61 for plasma lead-in is applied to the stage 52. In this embodiment, however, the area for the RF bias application is 320 $cm^2$ or thereabout, so that the power level per unit area is about 8 $W/cm^2$. Thus, the plasmas generated in the plasma chamber 21 are confined to the stage 52, and the frontage of a recess 83 is sputtered with Ar ions as the $SiO_2$ or SiOF film 82 is formed, as shown in FIG. 4A. When the $SiO_2$ or SiOF film 82 acquires a predetermined thickness, the microwaves power supply units 3 and 61 are turned off, and the valves V1 to V3 are closed to stop the gas supply, at time t4 shown in FIG. 2. This series of sequence control operations is performed by the control unit 7 in accordance with the sequence programs in the memory unit 71.

In the initial phase of film deposition, that is, in the state that the aluminum wiring is exposed or a scanty $SiO_2$ or SiOF film is formed, according to this method, the radio-frequency power for plasma lead-in is not applied to the stage 52, so that there is no damage to a gate oxide film already formed on the wafer W. At this point of time, the distribution of potential on the wafer surface depends on the potential distribution of the plasma. Since the potential difference of the plasma in the plane direction is as small as one volt at the most, however, the dispersion of the potential on the wafer surface is also small, as shown in FIG. 3B. Thus, a voltage applied to the gate oxide film can never exceed the withstand voltage of the oxide film, so that the film cannot be damaged.

The gate oxide film cannot be damaged either if the radio-frequency power for plasma lead-in is applied to the stage 52 when the thin $SiO_2$ or SiOF film with a certain thickness, e.g., 50 nm or thereabout, is formed on the surface of the aluminum wiring 81. More specifically, a self-bias is produced on the surface of the wafer W, as mentioned before, such that the perpendicularity of magnetic lines of force is poorer in the peripheral portion of the wafer W than in the central portion. As a result, electrons reach the peripheral portion with a delay, so that a substantial potential distribution is formed on the wafer surface, as shown in FIG. 4B. However, the thin $SiO_2$ or SiOF film already formed on the surface of the aluminum wiring 81 serves as a protective insulating film, so that the voltage applied to the gate oxide film is restricted to a lower level than in the case where the aluminum wiring is exposed, and can never exceed the withstand voltage of the oxide film.

Thus, in the initial phase of film deposition, the film is formed with use of, so to speak, a soft plasma without the application of the radio-frequency power for plasma lead-in. After the surface of the aluminum wiring 81 is protected with the thin $SiO_2$ or SiOF film, the radio-frequency power for plasma lead-in is applied so that the film is formed with use of an intensive anisotropic plasma. Accordingly, satisfactory embedding can be conducted without involving voids, and the gate oxide film cannot be damaged.

The initial phase of film deposition mentioned herein is not limited to the period of time before the very thin $SiO_2$ or SiOF film covers the wafer surface, and includes a phase in which the deposition of the $SiO_2$ or SiOF film advances to a certain extent such that the embedding can be secured without voids after the radio-frequency power for plasma lead-in is raised to a normal level.

Actual film deposition by the method according to the embodiment described above was compared with film deposition (prior art method) conducted in a manner such that the radio-frequency power for plasma lead-in was supplied together with microwave power. Thereupon, it was indicated that the prior art method involved about 5% gate oxide film breakage, while the method of the embodiment involved none.

The insulating film to be formed in this manner is not limited to the $SiO_2$ or SiOF film, and may be an SiN film or the like. Although the level of the radio-frequency power for plasma lead-in is zero (radio-frequency power supply unit 61 is off) before the thin insulating film is formed according to the embodiment described above, it need not always be zero as long as it is low enough not to damage the existing gate oxide film, e.g., at 1 $W/cm^2$ or less.

Also, at time t3 as shown in FIG. 2, radio-frequency power (RF bias power) of 2,500 W at 13.56 MHz from the radio-frequency power unit 61 is raised in a shape of pulse so as to be applied to stage 52, as described above. The power rising way, however, is not limited to the way shown in FIG. 2, and may be designed as follows. More-specifically, a delay circuit may be integrated into the power supply circuit, and then the switch may be turned on at time t3. In doing so, for example, as shown in FIG. 5A, the radio-frequency power may be caused to have a predetermined time constant, and may be slowly raised to 2,500 W. Alternatively, as shown in FIG. 5B, the radio-frequency power may be stepwise and after the passage of a predetermined period time (each step may last for one minute), may be caused to reach 2,500 W.

In such a case, in order to prevent the damage of the gate oxide film, preferably, lengthened is a period of time between time t2 that the microwaves power supply unit 3 for plasma generation is turned on and time t3 that radio-frequency power from the radio-frequency power supply unit 61 for plasma lead-in is applied, so that, the $SiO_2$ or SiOF film deposited on the surface of aluminum wiring 81 in the initial phase of the film deposition is made thicker. However, when the period time is lengthened as described above, the sputtering effect would be weakened so that there is a possibility that voids will be formed in the wiring. Accordingly, in comparison that at time t3 the radio-frequency power of 2,500 W is immediately applied, when at time t3 the radio-frequency power from the radio-frequency power supply unit 61 is slowly and slowly raised, as described above, the potential distribution formed in the plane of the wafer is made substantially flat, thus ensuring embedding with fewer voids and preventing the gate oxide film from being damaged.

According to the present invention, as described herein, existing thin films, such as the gate oxide film, can be prevented from being damaged as the insulating film is formed by the ECR plasma process.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A plasma deposition method, converting a plasma gas into a plasma by utilizing electron cyclotron resonance, and activating a reactive gas by the plasma to deposit an insulating film on a substrate to be treated, said method comprising the steps of:

forming a magnetic field towards a stage accommodated in a vacuum container and supporting the substrate to be treated thereon;

supplying microwaves to the vacuum container, generating resonance by an interaction of the supplied microwaves with the magnetic field so as to convert the plasma gas into the plasma;

applying bias radio-frequency power to the stage so as to lead in the plasma towards the stage, the level of the bias radio-frequency power being adjusted to a first value during an initial phase of film deposition wherein depositing of the insulating film begins; and continuing deposition of the film by raising the bias radio-frequency power slowly to a second value for plasma lead-in greater than the first value after the initial phase of film deposition has been completed, whereby damage to thin films present before said plasma deposition is prevented.

2. A plasma deposition method according to claim 1, wherein said raising the bias radio-frequency power includes the step of raising the bias power according to the non-linear function as shown in FIG. 5A.

3. A plasma deposition method according to claim 1, wherein said first value is set to zero.

4. A plasma deposition method according to claim 1, wherein said insulating film includes a $SiO_2$ or SiOF film.

5. A plasma deposition apparatus which converts a plasma gas into a plasma by utilizing electron cyclotron resonance, and activates a reactive gas by the plasma to deposit an insulating film on a substrate to be treated, said apparatus comprising:

a vacuum container having a stage for supporting the substrate to be treated thereon, the vacuum container maintaining the substrate substantially in a vacuum;

magnetic field forming means for forming a magnetic field towards the stage in the vacuum container;

plasma generating microwaves supplying means for supplying microwaves to the vacuum container, and thereby generating resonance by an interaction of the supplied microwaves with the magnetic field so as to convert the plasma gas into the plasma;

plasma lead-in bias radio-frequency power applying means for applying bias radio-frequency power to the stage so as to lead in the plasma towards the stage; and control means for controlling the plasma lead-in bias radio-frequency power applying means so that the level of the bias radio-frequency power is adjusted to a first value during an initial phase of film deposition wherein depositing of the insulating film begins, and then to a second value by slowly raising the level of the bias radio-frequency power after the initial phase of film deposition has been completed wherein deposition of the insulating film is continued, whereby damage to thin films present before plasma deposition by said plasma deposition apparatus is prevented.

6. A plasma deposition apparatus according to claim 5, wherein said control means controls said applying means to slowly raise the bias power according to the non-linear function shown in FIG. 5A.

7. A plasma deposition apparatus according to claim 5, wherein said first value is set to zero.

8. A plasma deposition apparatus according to claim 5, wherein said insulating film includes a $SiO_2$ or SiOF film.

* * * * *